US008416886B2

(12) United States Patent
Nihei et al.

(10) Patent No.: US 8,416,886 B2

(45) Date of Patent: Apr. 9, 2013

(54) RECEIVER

(75) Inventors: Tatsuyuki Nihei, Tokyo (JP); Keiichi Kajino, Tokyo (JP); Tatsuro Sato, Tokyo (JP); Yonghwan Lee, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 520 days.

(21) Appl. No.: 12/696,303

(22) Filed: Jan. 29, 2010

(65) Prior Publication Data

US 2010/0215122 A1 Aug. 26, 2010

(30) Foreign Application Priority Data

Jan. 29, 2009 (JP) ................................ 2009-018188

(51) Int. Cl.

*H04L 27/26* (2006.01)
*H04L 1/20* (2006.01)
*H04N 5/44* (2006.01)
*H04B 1/30* (2006.01)
*H04B 1/28* (2006.01)

(52) U.S. Cl.

USPC .......................................................... 375/316

(58) Field of Classification Search .................. 375/316

See application file for complete search history.

(56) References Cited

U.S. PATENT DOCUMENTS 6,377,782 B1 * 4/2002 Bishop et al. ................ 455/3.01
2008/0112508 A1 * 5/2008 Ishizaki et al. ................ 375/316
2009/0145778 A1 * 6/2009 Allmendinger .............. 205/789

FOREIGN PATENT DOCUMENTS

JP 2004-135306 4/2004

* cited by examiner

*Primary Examiner* — Erin File

(74) *Attorney, Agent, or Firm* — Alan A. R. Cooper; Wade J. Brady, III; Frederick J. Telecky, Jr.

(57) ABSTRACT

A receiver is provided that has reduced power consumption and seldom operates erroneously. The receiver generally includes: an input circuit or photoreceptor that receives a modulated digital signal that can includes a preamble; a detector that detects the received digital signal and outputs a baseband signal; a comparator that compares baseband signal and a reference signal; an integration circuit that integrates baseband signal; hysteresis circuits that generates voltage signals based on an average value signal from integration circuit; a multiplexer that selects between the signals from the hysteresis circuits based on a digital output signal from comparator; and a pulse detection counter that counts the number of pulses of the digital signal from comparator and outputs a count signal to one of the hysteresis circuits.

18 Claims, 3 Drawing Sheets

RECEIVER

CROSS-REFERENCE TO RELATED APPLICATIONS

This application is claims priority from Japanese Patent Application No. 2009-018188, filed Jan. 29, 2009, which is hereby incorporated by reference for all purposes.

FIELD OF THE INVENTION

The invention relates generally to a receiver, and more particularly, to a battery driven receiver.

BACKGROUND

FIG. 1 shows a digital signal receiver used, for example, in infrared communications. The receiver 10 generally comprises: an amplifier 20 that receives a modulated (for example, ASK modulated) digital signal (i.e., from a photodiode or an antenna); a detector 30 that detects the signal amplified by amplifier 20 and extracts a baseband signal which is the direct current component thereof; an integration circuit 40 that integrates the baseband signal and outputs a reference signal which is the average value of the received signal; a comparator 50 that compares the voltage of the baseband signal and the voltage of the reference signal from integration circuit 40 and outputs the comparison result as a digital signal; and a signal detector 60 that processes the digital signal output from comparator 50.

With typical infrared communication, when meaningful data is transmitted a bit pattern or preamble is added to the header portion of the data. Accordingly, when a signal that includes meaningful data is received and signal detector 60 detects a signal with the preamble output from comparator 50, it determines that intended data has been received and outputs a digital signal. On the other hand, when signal detector 60 cannot detect a preamble, it concludes that meaningless data caused by noise has been received and does not output a digital signal. If the voltage of the reference signal for comparator 50 is lowered to improve the sensitivity of the receiver, the comparator 50 will detect slight noise or glitches included in the received signal; to generally overcome this problem, Japanese Kokai Patent Application No. 2004-135306 discloses a demodulator which imparts hysteresis to the reference signal, thus reducing erroneous operation.

With conventional receiver 10, though, it operates even when there is no signal; that is, when there is no meaningful data. Comparator 50 continues to output a digital signal, and signal detector 60 detects continuously monitors for a preamble. This continuous operation of the signal detector 60 and comparator 50 wastefully consumes power when no signal is present. Therefore, there is a need for a receiver with lower power consumption.

SUMMARY

The receiver according to a preferred embodiment of the present invention has: a receiving means that receives a modulated digital signal the header of which includes identification information that indicates whether data is present; a demodulation means that demodulates the received digital signal; a comparison means that compares the demodulated received signal and a reference signal, outputting a digital signal according to the comparison result; a reference signal generation means that generates the reference signal; a first varying means that varies the voltage level of the reference signal according to the logic of the digital signal output from the comparison means; a counting means that counts pulses corresponding to the identification information of the digital signal output from the comparison means; a second varying means that varies the voltage level of the reference signal based on the counting results from the counting means; and a signal processing means that processes the digital signal output from the comparison means.

Preferably, the second varying means varies the voltage level of the reference signal when the count value of the counting means matches a predetermined value. Preferably, the signal processing means begins operation in response to a transition in the logic level of the digital signal output from the comparison means. Alternatively, the signal processing means begins operation based on the counting result of the counting means. Preferably, the first varying means includes a selection circuit that inputs a first signal voltage generated by the reference signal generation means and a second signal voltage generated from said first signal voltage, selects the first signal voltage or the second signal voltage according to the logic level of the digital signal output by the comparison means, and makes this the reference signal. Preferably, the second varying means includes a varying circuit that varies the first signal voltage based on the counting result of the counting means.

Furthermore, the receiver according to a preferred embodiment of the present invention has: a receiving device that receives a modulated digital signal whose header includes identification information that indicates whether data is present; a detector that detects the received digital signal and outputs a baseband signal; a comparator that compares the baseband signal and a reference signal, outputting a digital signal according to the comparison result; an integration circuit that integrates the baseband signal; a lower side hysteresis voltage generation circuit that generates a lower side hysteresis signal based on an average value signal generated by the integration circuit; an upper side hysteresis voltage generation circuit that generates an upper side hysteresis signal based on the average value signal; a selection circuit that selects the lower side hysteresis signal or upper side hysteresis signal based on the logic level of the digital signal output from the comparator and makes this the reference signal; a pulse detection counter that counts the number of pulses corresponding to the identification information of the digital signal output from the comparator and that outputs a count signal indicating that the pulse count has reached a prescribed value; a varying circuit that varies the voltage level of the upper side hysteresis signal based on the count signal; and a digital circuit that processes the digital signal output from the comparator.

Preferably, the upper side hysteresis voltage generation circuit includes an amplifier that amplifies the difference between the average value signal and the output voltage from the varying circuit, and the varying circuit varies the output voltage according to the count signal. Preferably, the receiving means receives a digital signal transmitted by infrared communication. Preferably, the receiver is driven by a battery. Preferably, the receiver is formed in a single integrated circuit chip.

In accordance with a preferred embodiment of the present invention, an apparatus is provided. The apparatus comprises an input circuit; intermediate circuitry that is coupled to the input circuit and that outputs baseband signal; a reference signal generator that provide a reference signal; a comparator that is coupled to the reference signal generator and the intermediate circuitry so as to compare the baseband signal to the reference signal to generate a digital output signal; a first setting circuit that provides a first setting signal to the reference signal generator, wherein the first setting signal sets the reference signal to a first level; a second setting circuit that provides a second setting signal to the reference signal generator, wherein the second setting signal sets the reference signal to a second level, and wherein the second setting circuit outputs the second setting signal when the second setting circuit receives a count signal that indicates that a preamble in the baseband signal is present; and a counter that is coupled to the comparator and the second setting circuit, wherein the counter counts the pulses of the digital output signal, and wherein the counter outputs the counter signal to the second setting circuit that indicates that the preamble in the baseband signal is present.

In accordance with a preferred embodiment of the present invention, the intermediate circuitry further comprises a demodulator that is coupled to the input circuit.

In accordance with a preferred embodiment of the present invention, the first setting circuit is coupled to the comparator so as to receive the digital output signal.

In accordance with a preferred embodiment of the present invention, the apparatus further comprises a signal processor that is coupled to the comparator.

In accordance with a preferred embodiment of the present invention, the intermediate circuitry further comprises: an amplifier that is coupled to the input circuit; and a detector that is coupled to the amplifier.

In accordance with a preferred embodiment of the present invention, the detector further comprises: a diode that is coupled to the amplifier; a resistor that is coupled between the diode and ground; and a capacitor that is coupled in parallel to the resistor.

In accordance with a preferred embodiment of the present invention, the apparatus further comprises an integration circuit that is coupled to the detector.

In accordance with a preferred embodiment of the present invention, the first setting and second setting circuits further comprise: a first hysteresis circuit that is coupled to the integration circuit; and a second hysteresis circuit that is coupled to the integration circuit.

In accordance with a preferred embodiment of the present invention, the reference signal generator further comprises a multiplexer having a first input terminal, a second input terminal, a selection terminal, and an output terminal, wherein the first input terminal of the multiplexer is coupled to the second hysteresis circuit, and wherein the second input terminal of the multiplexer is coupled to the first hysteresis circuit, and wherein the select terminal is coupled to the comparator so as to receive the digital output signal, and wherein the output terminal of the multiplexer is coupled to the comparator.

In accordance with a preferred embodiment of the present invention, the first hysteresis circuit further comprises a resist that is coupled between the integration circuit and ground.

In accordance with a preferred embodiment of the present invention, the second hysteresis circuit further comprises: a differential amplifier that is coupled to the integration circuit and first input terminal of the multiplexer; and a variable voltage source that is coupled to the differential amplifier and that is controlled by the counter.

In accordance with a preferred embodiment of the present invention, the apparatus further comprises: a digital front end (DFE) that is coupled to the comparator; and a memory that is coupled to the DFE.

In accordance with a preferred embodiment of the present invention, a method is provided. The method comprises generating a baseband signal; comparing the baseband signal to reference signal to generate a digital output signal; determining whether a preamble is present in the baseband signal based at least in part on the digital output signal; and adjusting the reference signal, if the preamble is not present in the baseband signal, based at least in part on at least one of the baseband signal and the digital output signal.

In accordance with a preferred embodiment of the present invention, the step of generating further comprises demodulating an input signal to generate the baseband signal.

In accordance with a preferred embodiment of the present invention, the step of determining further comprises: counting pulses of the digital output signal; and comparing the counted pulses to a predetermined threshold.

In accordance with a preferred embodiment of the present invention, the step of generating further comprises: amplifying an input signal; and generating the baseband signal from the amplified input signal with a detector.

In accordance with a preferred embodiment of the present invention, the step of adjusting further comprises: generate an average signal; determining a first voltage level with a first hysteresis circuit from the average signal; determining a second voltage level with a second hysteresis circuit from the average signal; and selecting between the first and second voltage levels based on the digital output signal.

In accordance with a preferred embodiment of the present invention, the step of determining further comprises: counting pulses of the digital output signal; and comparing the counted pulses to a predetermined threshold.

In accordance with a preferred embodiment of the present invention, the step of adjusting further comprises adjusting the second voltage level with variable voltage source if the preamble is present in the baseband signal.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
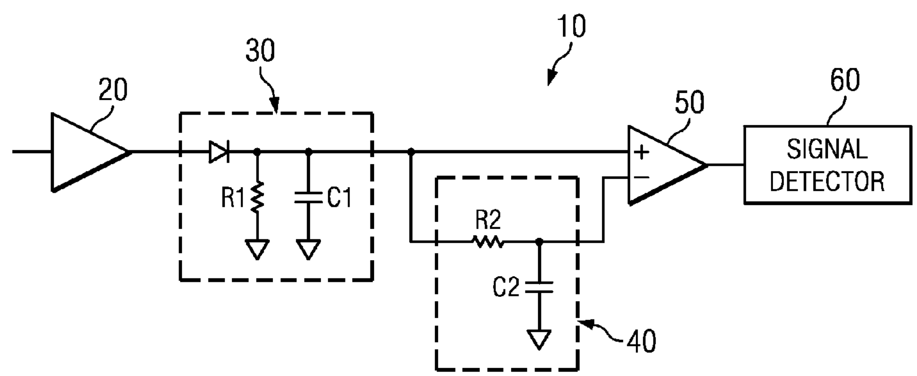
FIG. 1 is a diagram showing the configuration of a conventional receiver.

Refer now to the drawings wherein depicted elements are, for the sake of clarity, not necessarily shown to scale and wherein like or similar elements are designated by the same reference numeral through the several views.

Figure 2:
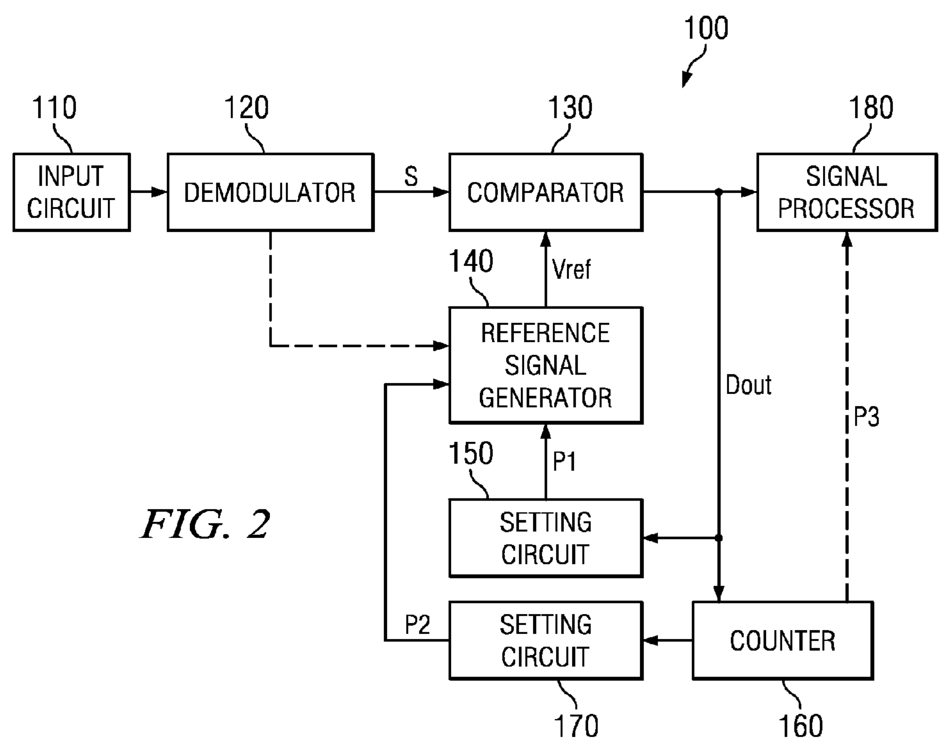
FIGS. 2 and 3 are a block diagram showing configurations of a receiver according to a preferred embodiment of the present invention.

Referring to FIG. 2 of the drawings, the reference numeral 100 generally designates a receiver in accordance with a preferred embodiment of the present invention. The receiver 100 generally comprises an input circuit 110, a demodulator 120, a comparator 130, a reference signal generator 140, setting circuits 150 and 170, counter 160, and signal processor 180.

Input circuit 110 receives a modulated digital signal whose header includes identification information that indicates whether data is present. To do this, input circuit 110 receives an optically modulated digital signal or an RF-modulated digital signal. Typically, input circuit 110 can include a photodiode or a phototransistor as a photoreceptor, and when an optically modulated digital signal is received, input circuit 110 can output an electrical signal which has been optoelectrically converted by the photoreceptor. Furthermore, input circuit 110 can include an antenna, and when an RF-modulated digital signal is received via the antenna, it can output the received electrical signal.

Demodulator 120 and comparator 130 can then generate the digital output signal DOUT. To do this, demodulator 120 demodulates and detects a modulated digital signal from input circuit 110 and outputs a demodulated received signal S to comparator 130, and comparator 130 compares the demodulated received signal S and a reference signal VREF. The digital output signal DOUT which, for example, is logic high or "1" when signal S is equal to or higher than signal VREF and is logic low or "0" when signal S is lower than signal VREF.

To generate the reference voltage signal VREF, reference signal generator 140 uses signal output from setting circuits 150 and 170. Setting circuit 150 varies the voltage level of reference signal VREF based on the digital output signal DOUT from comparator 130, and when comparator 130 outputs a "0", setting circuit 150 supplies a signal P1 to reference signal generator 140 such that the voltage level of reference signal VREF increases, which increases the difference between signal S and reference voltage VREF increases when there is no signal to generally suppress erroneous operation of comparator 130. Additionally, when comparator 130 outputs a "1", setting circuit 150 supplies to reference signal generator 140 a signal P1 such that the voltage level of reference signal VREF decreases, which increases the difference between signal S and reference voltage VREF. When a signal that includes a preamble is received, comparator 130 outputs a pulse signal corresponding to all or a part of the preamble, and counter 160 counts the pulse signal. When the count value reaches a predetermined value, counter 160 determines that a preamble has been detected and outputs a signal to setting circuit 170. Setting circuit 170 (based on the signal from counter 160) supplies a signal P2 to reference signal generator 140 such that the voltage level of reference signal VREF decreases. Thus, the reception sensitivity of comparator 130 improves. Alternatively, reference signal generator 140 can generate reference signal VREF based on the signal obtained from input circuit 110 or demodulator 120.

With receiver 100, there is essentially no need for signal processor 180 to operate when there is no signal. Signal processor 180 can, for example, begin operating in response to a transition (from "1" to "0" or from "0" to "1") in the logic level of the digital output signal DOUT output from comparator 130. Alternatively, signal processor 180 can begin operating in response to a signal P3 indicating that counter 160 has detected a preamble. Signal processor 180 can begin operating when digital output signal DOUT transitions or when there is an interrupt, with signal P3 serving as said interrupt. When counter 160 detects a preamble, signal processor 180 essentially begins operating after the preamble is detected, so that the power consumption of the receiver 100 can be significantly reduced.

Figures 3, 4:
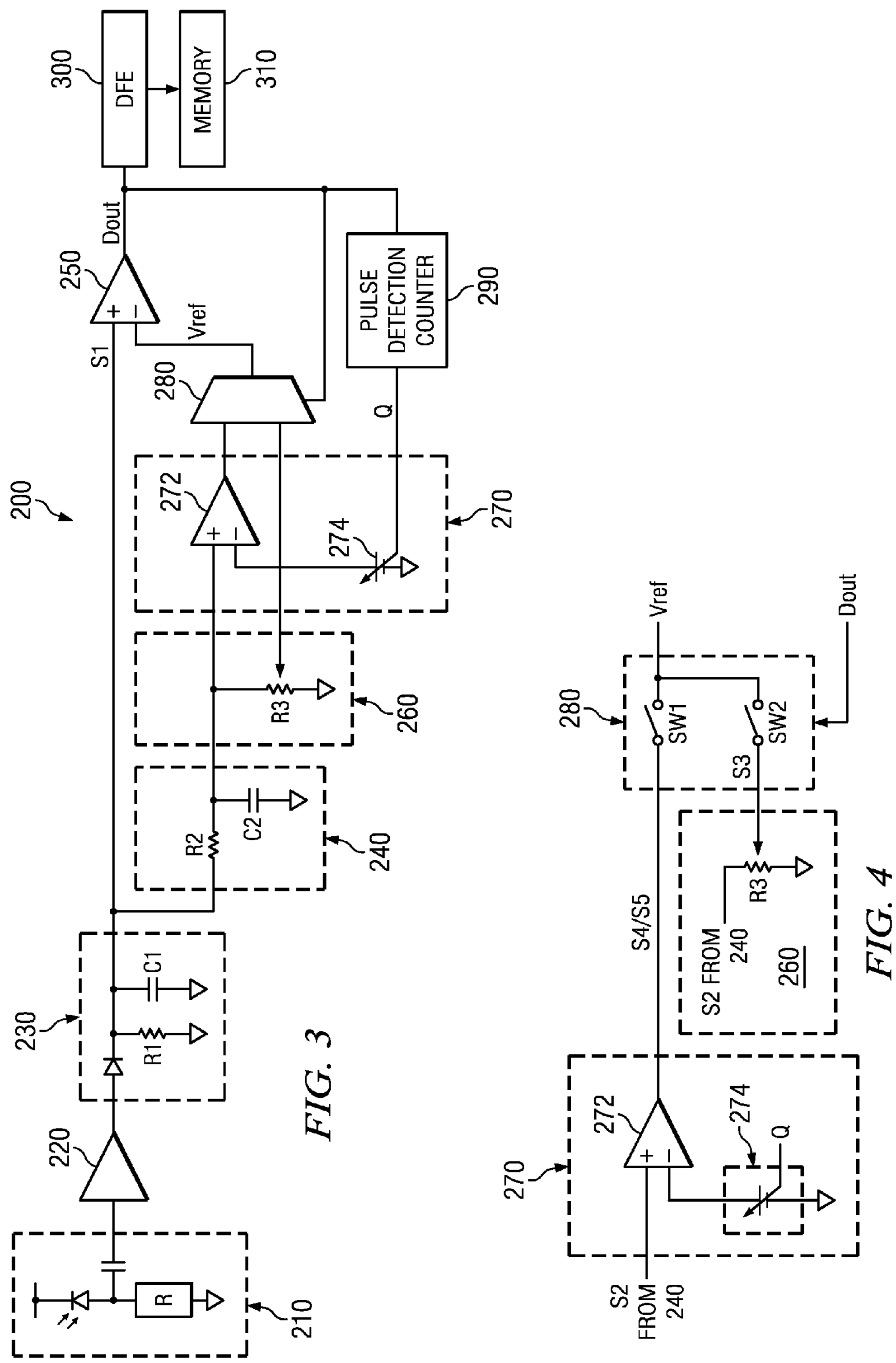
FIG. 4 is a detailed diagram showing the selector of the receiver shown in FIG. 3.

Turning to FIG. 3, a battery-driven receiver 200 in accordance with a preferred embodiment of the present invention can be seen. Receiver 200 generally comprises a photoreceptor 210, an amplifier 220, a detector 230, an integration circuit 240, a comparator 250, a hysteresis circuits 260 and 270, a multiplexer 280, pulse detection counter 290, digital front end (DFE) 300, and memory 310. Photoreceptor 210 can be a photodiode or phototransistor. Detector 230 generally comprises a diode, resistor R1, and capacitor C1. Integration circuit 240 generally comprises a filter (resistor R2 and capacitor C2). Hysteresis circuit 260 generally comprises a resistor R3 that can be variable resistor, rheostat, or potentiometer. Hysteresis circuit 270 general comprises a differential amplifier 272 and variable voltage source 274. Receiver 200 can also be constructed as an integrated circuit on a single silicon chip.

In operation, photoreceptor 210 receives an optical modulation signal and generates an electrical signal that is amplified by amplifier 220. Detector 230 extracts a baseband signal S1 from the output of amplifier 220, which is the direct current component of the output of amplifier 220. Integration circuit 240 integrates baseband signal S1 and outputs a reference signal which is the average value of the received signal. Hysteresis circuit 260 and 270 each receive an output from the integration circuit 240. Based on this output, hysteresis circuits 260 and 270 generate lower and upper voltage signals, respectively, which are provided to multiplexer 280. Multiplexer 280 selects between the upper and lower voltage signals from hysteresis circuits 260 and 270 to generate the reference signal VREF. Comparator 250 compares the baseband signal S1 and a reference signal VREF to outputs a digital output signal DOUT with a voltage level corresponding to the comparison result. This digital output signal DOUT is used as a selection signal form multiplexer 280. Additionally, pulse detection counter 290 counts the pulses included in the digital output signal DOUT to adjust the hysteresis circuit 270 with signal Q. A DFE (which also includes error correction) 300 receives the digital output signal DOUT, and a memory 310 can store information from the DFE 300.

Turning to FIG. 4, a detailed diagram of multiplexer 280 and hysteresis circuits 260 and 270 can be seen. Hysteresis circuit 250 generates a lower voltage signal S3 with a resistor R3 that receives the output or average signal S2 from integration circuit 240; signal S3 is supplied to switch SW2 of multiplexer 280. Hysteresis circuit 270 receives the average value signal S2 from integration circuit 240 at the non-inverting input of differential amplifier 272, while the variable voltage source 274 is coupled to the inverting input of differential amplifier 272. Differential amplifier 272 amplifies the difference between the output from the variable voltage source 272 and average value signal S2 to achieve a gain greater than "1", and the amplified signal S4 or S5 is supplied to a switch SW1 of multiplexer 280. Additionally, the voltage of variable voltage source 274 is varied by a signal Q output from pulse detection counter 290.

In operation, multiplexer 280 switches between opening/closing of switches SW1 and SW2 based on the digital output signal DOUT from comparator 250 to select the reference signal VREF supplied to comparator 250. When the level of digital output signal DOUT is "1", multiplexer 280 opens switch SW1 and closes switch SW2, selecting signal S3. Conversely, when the level of digital output signal DOUT is "0", multiplexer 280 closes switch SW1 and opens switch SW2, selecting the signal S4 or S5 from differential amplifier 272.

Pulse detection counter 290 counts the number of pulses included in the digital output signal DOUT from comparator 250 and outputs to variable voltage source 274 a count signal Q indicating whether the pulse count has reached a predetermined value. Generally, pulse detection counter 290 outputs count signal Q with a "1" when the pulse count reaches the predetermined value and outputs count signal Q with a "0" otherwise. In other words, when there are no signals, the level of count signal Q "0", and when meaningful data has been received, the level of count signal Q "1". The target pulse count for pulse detection counter 290 can be appropriately set according to the preamble, and it can be reset periodically.

Based on the signal Q, the variable voltage source 274 generates a voltage for differential amplifier 272. When signal Q is "0", voltage V1 is output from variable voltage source 274 is, and when signal Q is "1", voltage V2 (which is greater than voltage V1) is output from variable voltage source 274. Differential amplifier 272 outputs a signal S4 with a relatively high voltage level due to the difference between voltage V1 and average value signal S2 and outputs a signal S5 with a relatively high voltage level according to the difference between voltage V2 and average value signal S2. Accordingly, when count signal Q transitions from level L to level H, the voltage of reference signal VREF decreases. In particular, reference signal VREF varies in response to the following operating conditions: (1) when there is no signal (when signal Q from the pulse detection counter is "0"), the level of digital output signal DOUT is "0", and the signal S4 of differential amplifier 272 is selected as reference signal VREF; (2) when there is no signal (when signal Q from the pulse detection counter is "0"), the level of digital output signal DOUT is "1", and signal S2 is selected as reference signal VREF; (3) when a preamble is detected (when signal Q from the pulse detection counter is "1"), the level of digital output signal DOUT is "0", and signal S5 of differential amplifier 272 is selected as reference signal VREF; and (4) when a preamble is detected (when signal Q from the pulse detection counter is "1"), the level of digital output signal DOUT is "1", and signal S2 is selected as reference signal VREF.

DFE 300 receives the digital output signal DOUT from comparator 250 and uses a redundant bit to correct digital signal errors. DFE 300 does not generally operate continuously; it operates in response to a transition (from "1" to "0" or from "0" to "1") in the voltage level of the digital signal. Receive buffer memory 310 stores the received digital signal and outputs it in response to a request from an external circuit.

Figure 5:
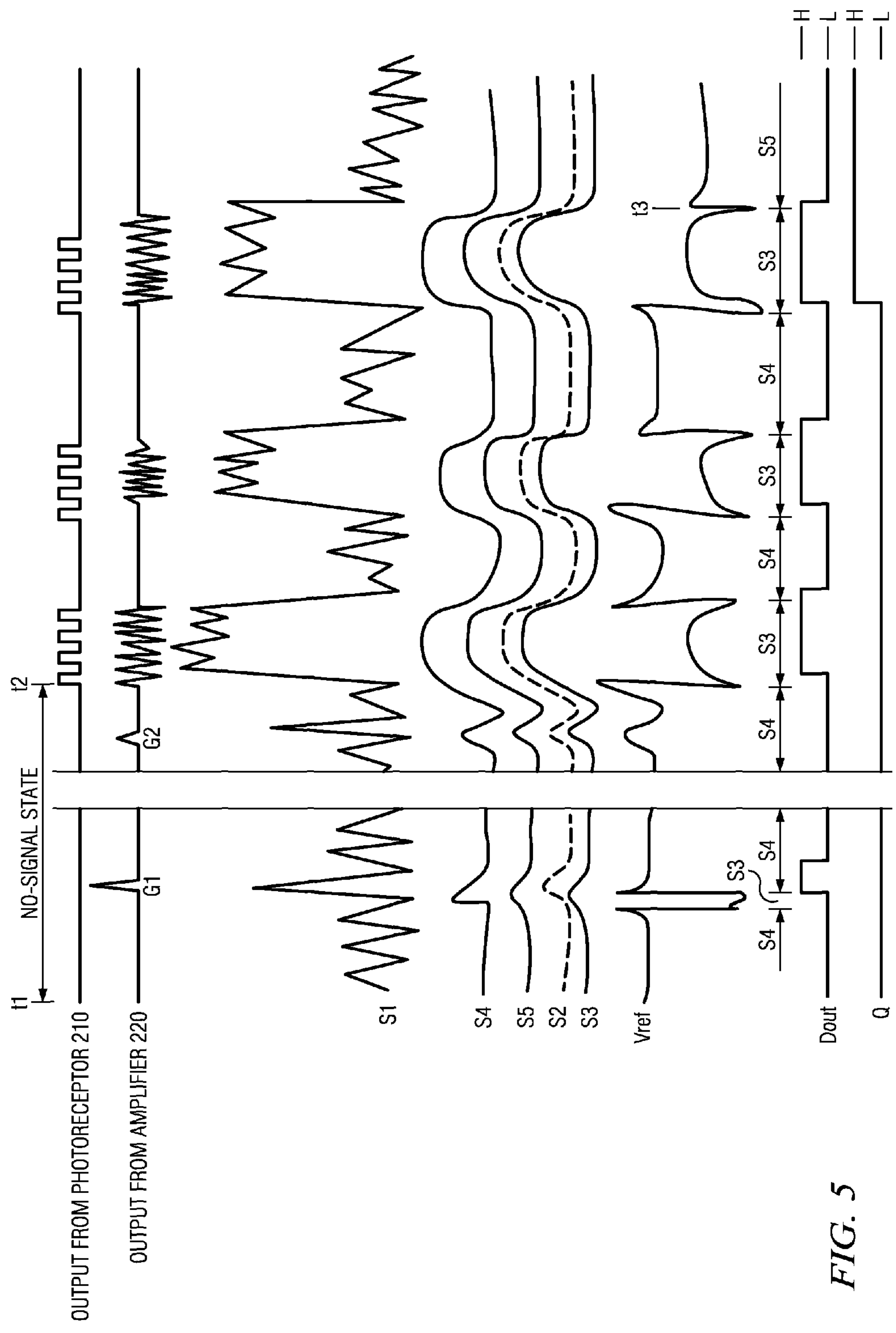
FIG. 5 is a timing diagram for the receiver of FIG. 3.

Turning now to FIG. 5, a timing diagram for receiver 200 can be seen. For the interval from time t1 to time t2, there is a no-signal state during which the optical modulation signal (output from photoreceptor 210) does not contain meaningful data. During this interval the output from amplifier 220 is basically at a low level, but when noise occurs, pulses G1 and G2 are generated in response. The baseband signal S1 output from detector 230 shows an envelope curve, and the average value signal (the dashed line) S2 output from integration circuit 240 shows the average voltage for the envelope curve. Signal S3, which is output from hysteresis circuit 260, has a lower voltage than that of average value signal S2. The signal S4 output from differential amplifier 272 is the signal that occurs when the pulse detection counter does not detect a pulse (when signal Q is "0"), and the signal S5 output from differential amplifier 272 is the signal that occurs when the pulse detection counter detects a pulse (when signal Q is "1"); it has a voltage level lower than that of signal S4. Reference signal VREF is thus varied according to the output digital output signal DOUT and signal Q from the pulse detection counter 290 and, as shown in the figure, switches among signals S3, S4, and S5.

As can be seen in FIG. 5, when there is no signal, baseband signal Si is at a low level and the digital output signal DOUT from comparator 250 becomes "0". When this state continues, the average value signal S2 generated by integration circuit 240 becomes almost identical to the average value of baseband signal S1. However, when digital output signal DOUT is "0", multiplexer 280 selects signal S4 from differential amplifier 272, so the situation where the difference in potential with respect to baseband signal S1 is large continues, and digital output signal DOUT is output at a low level, making it possible to maintain a state in which it is difficult to receive noise.

After time t2, when a preamble is detected, baseband signal S1 outputs a high-level signal corresponding to the preamble. When this state continues, the average value signal S2 from integration circuit 240 approaches the average value of baseband signal S1; however, multiplexer 280 selects signal S3 in response to the "1" of digital output signal DOUT. The difference in potential with respect to baseband signal S1 therefore increases, making comparator 250 less susceptible to noise. When pulse detection counter 290 counts the target number of pulses, it determines that a preamble has been received, and pulse detection counter 290 outputs a "1" as signal Q to variable voltage source 274. Variable voltage source 274 changes the output voltage from voltage V1 to voltage V2 in response. Thus, the output signal S5 from differential amplifier 272 is output, and the voltage level of reference signal VREF decreases. In FIG. 5, when pulse detection counter 290 counts three pulse signals, signal Q becomes high level and reference signal VREF switches to output signal S5 at time t3. Comparator 250 can thus detect the data included in the received signal with good sensitivity.

Accordingly, reference signal VREF of comparator 250 is generated from integration circuit 240, making it possible to respond to variations in the reception strength and the noise level. When pulse detection counter 290 is used and the pulse count reaches a specified number, it is determined that reception data is present, and reception sensitivity can be increased by lowering the voltage of reference signal VREF of the upper side of the comparator when a received signal is present.

Furthermore, it is not necessary to operate the digital circuit, which operates at high speed, during idle time, so the desired function can be implemented with low power consumption. The effect is particularly significant with a battery-driven application. By dynamically changing the comparator's reference signal, it is possible to respond to changes in environmental conditions such as changes in the level of external noise, temperature, the power source voltage, and variation in device characteristics. To avoid erroneous detection due to noise, a conventional comparator must increase the reference signal to a level sufficiently higher than that of the noise, thus decreasing reception sensitivity, but using a pulse detector and making the comparison level variable make it possible to prevent erroneous detection due to noise and achieve high sensitivity at the same time.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:

an input circuit;

intermediate circuitry that is coupled to the input circuit and that outputs baseband signal;

a reference signal generator that provide a reference signal;

a comparator that is coupled to the reference signal generator and the intermediate circuitry so as to compare the baseband signal to the reference signal to generate a digital output signal;

a first setting circuit that provides a first setting signal to the reference signal generator, wherein the first setting signal sets the reference signal to a first level;

a second setting circuit that provides a second setting signal to the reference signal generator, wherein the second setting signal sets the reference signal to a second level, and wherein the second setting circuit outputs the second setting signal when the second setting circuit receives a count signal that indicates that a preamble in the baseband signal is present; and a counter that is coupled to the comparator and the second setting circuit, wherein the counter counts the pulses of the digital output signal, and wherein the counter outputs the counter signal to the second setting circuit that indicates that the preamble in the baseband signal is present.

2. The apparatus of claim 1, wherein the intermediate circuitry further comprises a demodulator that is coupled to the input circuit.

3. The apparatus of claim 2, wherein the first setting circuit is coupled to the comparator so as to receive the digital output signal.

4. The apparatus of claim 3, wherein the apparatus further comprises a signal processor that is coupled to the comparator.

5. The apparatus of claim 1, wherein the intermediate circuitry further comprises:

an amplifier that is coupled to the input circuit; and a detector that is coupled to the amplifier.

6. The apparatus of claim 5, wherein the detector further comprises:

a diode that is coupled to the amplifier;

a resistor that is coupled between the diode and ground; and a capacitor that is coupled in parallel to the resistor.

7. The apparatus of claim 5, wherein the apparatus further comprises an integration circuit that is coupled to the detector.

8. The apparatus of claim 7, wherein the first setting and second setting circuits further comprise:

a first hysteresis circuit that is coupled to the integration circuit; and a second hysteresis circuit that is coupled to the integration circuit.

9. The apparatus of claim 8, wherein the reference signal generator further comprises a multiplexer having a first input terminal, a second input terminal, a selection terminal, and an output terminal, wherein the first input terminal of the multiplexer is coupled to the second hysteresis circuit, and wherein the second input terminal of the multiplexer is coupled to the first hysteresis circuit, and wherein the select terminal is coupled to the comparator so as to receive the digital output signal, and wherein the output terminal of the multiplexer is coupled to the comparator.

10. The apparatus of claim 9, wherein the first hysteresis circuit further comprises a resist that is coupled between the integration circuit and ground.

11. The apparatus of claim 9, wherein the second hysteresis circuit further comprises:

a differential amplifier that is coupled to the integration circuit and first input terminal of the multiplexer; and a variable voltage source that is coupled to the differential amplifier and that is controlled by the counter.

12. The apparatus of claim 9, wherein the apparatus further comprises:

a digital front end (DFE) that is coupled to the comparator; and a memory that is coupled to the DFE.

13. A method comprising:

demodulating an input signal to generate a baseband signal;

comparing the baseband signal to reference signal to generate a digital output signal;

determining whether a preamble is present in the baseband signal based at least in part on the digital output signal; and adjusting the reference signal, if the preamble is not present in the baseband signal, based at least in part on at least one of the baseband signal and the digital output signal.

14. The method of claim 13, wherein the step of determining further comprises:

counting pulses of the digital output signal; and comparing the counted pulses to a predetermined threshold.

15. A method comprising:

generating a baseband signal;

comparing the baseband signal to reference signal to generate a digital output signal;

determining whether a preamble is present in the baseband signal based at least in part on the digital output signal; and adjusting the reference signal, if the preamble is not present in the baseband signal, based at least in part on at least one of the baseband signal and the digital output signal by:

generating an average signal;

determining a first voltage level with a first hysteresis circuit from the average signal;

determining a second voltage level with a second hysteresis circuit from the average signal; and selecting between the first and second voltage levels based on the digital output signal.

16. The method 15, wherein the step of generating further comprises:

amplifying an input signal; and generating the baseband signal from the amplified input signal with a detector.

17. The method of claim 15, wherein the step of determining further comprises:

counting pulses of the digital output signal; and comparing the counted pulses to a predetermined threshold.

18. The method of claim 17, wherein the step of adjusting further comprises adjusting the second voltage level with variable voltage source if the preamble is present in the baseband signal.

* * * * *